United States Patent
Jackson et al.

(10) Patent No.: US 6,972,622 B2
(45) Date of Patent: Dec. 6, 2005

(54) OPTIMIZATION OF ERROR LOOPS IN DISTRIBUTED POWER AMPLIFIERS

(75) Inventors: Donald G. Jackson, Garland, TX (US); Russell J. Hoppenstein, Richardson, TX (US)

(73) Assignee: Andrew Corporation, Orland Park, IL (US)

( * ) Notice: Subject to any disclaimer, the term of this patent is extended or adjusted under 35 U.S.C. 154(b) by 27 days.

(21) Appl. No.: 10/435,815

(22) Filed: May 12, 2003

(65) Prior Publication Data

US 2004/0227570 A1 Nov. 18, 2004

(51) Int. Cl.[7] .................................................. H03F 1/00
(52) U.S. Cl. ..................................... 330/151; 330/149
(58) Field of Search ............................. 330/151, 149, 330/52; 375/297; 455/63

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,124,852 A | 11/1978 | Steudel | 343/854 |
| 4,156,283 A | 5/1979 | Gilbert | 364/841 |
| 4,246,585 A | 1/1981 | Mailloux | 343/854 |
| 4,360,813 A | 11/1982 | Fitzsimmons | 343/100 R |
| 4,566,013 A | 1/1986 | Steinberg et al. | 343/372 |
| 4,607,389 A | 8/1986 | Halgrimson | 455/11 |
| 4,614,947 A | 9/1986 | Rammos | 343/778 |
| 4,689,631 A | 8/1987 | Gans et al. | 343/781 R |
| 4,825,172 A | 4/1989 | Thompson | 330/124 R |
| 4,849,763 A | 7/1989 | DuFort | 342/372 |
| 4,879,519 A | 11/1989 | Myer | 330/149 |
| 4,890,110 A | 12/1989 | Kuwahara | 342/35 |
| 4,978,873 A | 12/1990 | Shoemaker | 307/498 |
| 4,994,813 A | 2/1991 | Shiramatsu et al. | 342/360 |
| 5,023,565 A | 6/1991 | Lieu | 330/151 |
| 5,034,752 A | 7/1991 | Pourailly et al. | 342/373 |
| 5,038,150 A | 8/1991 | Bains | 342/373 |
| 5,049,832 A | 9/1991 | Carvers | 330/149 |
| 5,061,939 A | 10/1991 | Nakase | 343/700 MS |
| 5,115,409 A | 5/1992 | Stepp | 364/841 |
| 5,130,663 A | 7/1992 | Tattersall, Jr. | 330/52 |
| 5,206,604 A | 4/1993 | Vaninetti | 330/124 R |
| 5,230,080 A | 7/1993 | Fabre et al. | 455/15 |
| 5,247,310 A | 9/1993 | Waters | 342/368 |
| 5,248,980 A | 9/1993 | Raguenet | 342/354 |
| 5,270,721 A | 12/1993 | Tsukamoto et al. | 343/700 MS |
| 5,280,297 A | 1/1994 | Profera, Jr. | 343/754 |
| 5,323,119 A | 6/1994 | Powell et al. | 330/151 |

(Continued)

FOREIGN PATENT DOCUMENTS

EP 0 551 556 A1 7/1993 ............. H01P 5/08

(Continued)

OTHER PUBLICATIONS

Song, H.J. and Bialkowski, M.E., *A Multilayer Microstrip Patch Antenna Subarray Design Using CAD*, Microwave Journal, Mar. 1997, pp. 22-34 (8 pages).

(Continued)

*Primary Examiner*—Henry Choe
(74) *Attorney, Agent, or Firm*—Wood, Herron & Evans, L.L.P.

(57) ABSTRACT

Several feed-forward RF power amplifiers configured for use in a distributed array, each having a main amplifier within a carrier null loop and an error amplifier within an error loop. Each carrier null loop includes a switch configured to selectively disable the carrier null loop, thereby disabling the carrier null loop, and injecting an actual RF signal into the error loop allowing the error loop to be optimized using the actual RF signal.

22 Claims, 1 Drawing Sheet

U.S. PATENT DOCUMENTS

| | | | |
|---|---|---|---|
| 5,325,095 A | 6/1994 | Vadnais et al. | 342/22 |
| 5,327,150 A | 7/1994 | Cherrette | 343/771 |
| 5,355,143 A | 10/1994 | Zurcher et al. | 343/700 MS |
| 5,379,455 A | 1/1995 | Koschek | 455/273 |
| 5,412,414 A | 5/1995 | Ast et al. | 342/174 |
| 5,414,383 A | 5/1995 | Cusdin et al. | 329/304 |
| 5,437,052 A | 7/1995 | Hemmie et al. | 455/5.1 |
| 5,457,557 A | 10/1995 | Zarem et al. | 359/121 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,513,176 A | 4/1996 | Dean et al. | 370/18 |
| 5,528,196 A | 6/1996 | Baskin et al. | 330/151 |
| 5,548,813 A | 8/1996 | Charas et al. | 455/33.3 |
| 5,554,865 A | 9/1996 | Larson | 257/275 |
| 5,568,160 A | 10/1996 | Collins | 343/778 |
| 5,596,329 A | 1/1997 | Searle et al. | 342/374 |
| 5,604,462 A | 2/1997 | Gans et al. | 330/124 R |
| 5,610,510 A | 3/1997 | Boone et al. | 324/95 |
| 5,617,061 A | 4/1997 | Fukuchi | 330/151 |
| 5,619,210 A | 4/1997 | Dent | 342/352 |
| 5,621,354 A | 4/1997 | Mitzlaff | 330/52 |
| 5,621,422 A | 4/1997 | Wang | 343/895 |
| 5,623,269 A | 4/1997 | Hirshfield et al. | 342/354 |
| 5,644,316 A | 7/1997 | Lewis et al. | 342/174 |
| 5,644,622 A | 7/1997 | Russell et al. | 455/422 |
| 5,646,631 A | 7/1997 | Arntz | 342/373 |
| 5,657,374 A | 8/1997 | Russell et al. | 370/328 |
| 5,659,322 A | 8/1997 | Caille | 342/188 |
| 5,680,142 A | 10/1997 | Smith et al. | 342/372 |
| 5,691,668 A | 11/1997 | Yoshikawa et al. | 330/151 |
| 5,710,804 A | 1/1998 | Bhame et al. | 379/58 |
| 5,714,957 A | 2/1998 | Searle et al. | 342/374 |
| 5,724,666 A | 3/1998 | Dent | 455/562 |
| 5,732,333 A | 3/1998 | Cox et al. | 455/115 |
| 5,745,841 A | 4/1998 | Reudink et al. | 455/62 |
| 5,751,250 A | 5/1998 | Arntz | 342/373 |
| 5,754,139 A | 5/1998 | Turcotte et al. | 342/373 |
| 5,758,287 A | 5/1998 | Lee et al. | 455/450 |
| 5,760,646 A | 6/1998 | Belcher et al. | 330/149 |
| 5,770,970 A | 6/1998 | Ikeda et al. | 330/286 |
| 5,771,017 A | 6/1998 | Dean et al. | 342/374 |
| 5,774,666 A | 6/1998 | Portuesi | 395/200.48 |
| 5,784,031 A | 7/1998 | Weiss et al. | 342/373 |
| 5,802,173 A | 9/1998 | Hamilton-Piercy et al. | 379/56.2 |
| 5,808,512 A | 9/1998 | Bainvoll et al. | 330/151 |
| 5,809,395 A | 9/1998 | Hamilton-Piercy et al. | 455/4.1 |
| 5,825,762 A | 10/1998 | Kamin, Jr. et al. | 370/335 |
| 5,831,478 A | 11/1998 | Long | 330/52 |
| 5,832,389 A | 11/1998 | Dent | 455/562 |
| 5,854,611 A | 12/1998 | Gans et al. | 342/373 |
| 5,856,804 A | 1/1999 | Turcotte et al. | 342/371 |
| 5,862,459 A | 1/1999 | Charas | 455/114 |
| 5,867,065 A | 2/1999 | Leyendecker | 330/149 |
| 5,872,547 A | 2/1999 | Martek | 343/815 |
| 5,877,653 A | 3/1999 | Kim | 330/149 |
| 5,878,345 A | 3/1999 | Ray et al. | 455/431 |
| 5,880,701 A | 3/1999 | Bhame et al. | 343/890 |
| 5,884,147 A | 3/1999 | Reudink et al. | 455/67.1 |
| 5,889,494 A | 3/1999 | Reudink et al. | 342/373 |
| 5,892,397 A | 4/1999 | Belcher et al. | 330/149 |
| 5,900,778 A | 5/1999 | Stonick et al. | 330/149 |
| 5,912,586 A | 6/1999 | Mitzlaff | 330/149 |
| 5,923,214 A | 7/1999 | Mitzlaff | 330/52 |
| 5,929,703 A | 7/1999 | Sehier et al. | 330/149 |
| 5,929,823 A | 7/1999 | Martek et al. | 343/817 |
| 5,933,113 A | 8/1999 | Newberg et al. | 342/375 |
| 5,933,766 A | 8/1999 | Dent | 455/103 |
| 5,936,577 A | 8/1999 | Shoki et al. | 342/373 |
| 5,959,499 A | 9/1999 | Khan et al. | 330/149 |
| 5,966,094 A | 10/1999 | Ward et al. | 342/373 |
| 5,969,689 A | 10/1999 | Martek et al. | 343/758 |
| 5,986,499 A | 11/1999 | Myer | 330/52 |
| 5,987,335 A | 11/1999 | Knoedl, Jr. et al. | 455/561 |
| 6,008,763 A | 12/1999 | Nystrom et al. | 343/700 MS |
| 6,016,123 A | 1/2000 | Barton et al. | 342/373 |
| 6,018,643 A | 1/2000 | Golemon et al. | 455/63 |
| 6,020,848 A | 2/2000 | Wallace et al. | 342/362 |
| 6,037,903 A | 3/2000 | Lange et al. | 343/700 MS |
| 6,043,790 A | 3/2000 | Dereryd et al. | 343/853 |
| 6,046,635 A | 4/2000 | Gentzler | 330/149 |
| 6,047,199 A | 4/2000 | DeMarco | 455/572 |
| 6,052,023 A | 4/2000 | Myer | 330/2 |
| 6,055,230 A | 4/2000 | Feuerstein et al. | 370/335 |
| 6,070,090 A | 5/2000 | Feuerstein | 455/561 |
| 6,072,364 A | 6/2000 | Jeckeln et al. | 330/149 |
| 6,072,434 A | 6/2000 | Papatheodorou | 343/700 MS |
| 6,091,295 A | 7/2000 | Zhang | 330/149 |
| 6,091,360 A | 7/2000 | Reits | 342/368 |
| 6,091,715 A | 7/2000 | Vucetic et al. | 370/277 |
| 6,094,165 A | 7/2000 | Smith | 342/373 |
| 6,104,239 A | 8/2000 | Jenkins | 330/2 |
| 6,104,935 A | 8/2000 | Smith et al. | 455/562 |
| 6,118,335 A | 9/2000 | Nielsen et al. | 330/2 |
| 6,118,339 A | 9/2000 | Gentzler et al. | 330/149 |
| 6,125,266 A | 9/2000 | Matero et al. | 455/126 |
| 6,137,335 A | 10/2000 | Proebsting | 327/281 |
| 6,140,976 A | 10/2000 | Locke et al. | 343/853 |
| 6,141,390 A | 10/2000 | Cova | 375/297 |
| 6,144,255 A | 11/2000 | Patel et al. | 330/151 |
| 6,144,652 A | 11/2000 | Avidor et al. | 370/336 |
| 6,148,185 A | 11/2000 | Maruyama et al. | 455/115 |
| 6,154,641 A | 11/2000 | Zhang | 455/112 |
| 6,157,253 A | 12/2000 | Sigmon et al. | 330/10 |
| 6,157,343 A | 12/2000 | Andersson et al. | 342/371 |
| 6,160,514 A | 12/2000 | Judd | 343/700 MS |
| 6,181,276 B1 | 1/2001 | Schlekewey et al. | 342/372 |
| 6,188,373 B1 | 2/2001 | Martek | 343/893 |
| 6,195,556 B1 | 2/2001 | Reudink et al. | 455/456 |
| 6,198,434 B1 | 3/2001 | Martek et al. | 342/373 |
| 6,198,435 B1 | 3/2001 | Reudink et al. | 342/373 |
| 6,198,460 B1 | 3/2001 | Brankovic | 343/879 |
| 6,208,846 B1 | 3/2001 | Chen et al. | 455/127 |
| 6,211,733 B1 | 4/2001 | Gentzler | 330/149 |
| 6,222,503 B1 | 4/2001 | Gietema et al. | 343/890 |
| 6,233,466 B1 | 5/2001 | Wong et al. | 455/562 |
| 6,236,267 B1 | 5/2001 | Anzil | 330/149 |
| 6,236,837 B1 | 5/2001 | Midya | 455/63 |
| 6,236,849 B1 | 5/2001 | Reudink et al. | 455/342 |
| 6,240,274 B1 | 5/2001 | Izadpanah | 455/39 |
| 6,246,674 B1 | 6/2001 | Feuerstein et al. | 370/334 |
| 6,255,903 B1 * | 7/2001 | Leffel | 330/51 |
| 6,269,255 B1 | 7/2001 | Waylett | 455/562 |
| 6,275,685 B1 | 8/2001 | Wessel et al. | 455/126 |
| 6,285,251 B1 | 9/2001 | Dent et al. | 330/127 |
| 6,285,255 B1 | 9/2001 | Luu et al. | 330/149 |
| 6,304,140 B1 | 10/2001 | Thron et al. | 330/149 |
| 6,337,599 B2 | 1/2002 | Lee | 330/149 |
| 6,342,810 B1 | 1/2002 | Wright et al. | 330/51 |
| 6,353,360 B1 | 3/2002 | Hau et al. | 330/149 |
| 6,356,146 B1 | 3/2002 | Wright et al. | 330/2 |
| 6,359,508 B1 | 3/2002 | Mucenieks | 330/149 |
| 6,377,558 B1 | 4/2002 | Dent | 370/321 |
| 6,377,785 B1 | 4/2002 | Ogino | 455/127 |
| 6,414,545 B1 | 7/2002 | Zhang | 330/149 |
| 6,424,214 B2 * | 7/2002 | Sera et al. | 330/151 |
| 6,424,215 B1 * | 7/2002 | Rice | 330/151 |
| 6,456,160 B1 * | 9/2002 | Nakayama et al. | 330/52 |
| 6,512,417 B2 | 1/2003 | Booth et al. | 330/149 |

FOREIGN PATENT DOCUMENTS

| | | | |
|---|---|---|---|
| EP | 0 639 035 A1 | 2/1995 | H04Q 7/36 |

| | | | | |
|---|---|---|---|---|
| EP | 0 713 261 A1 | 5/1996 | ............ | H01Q 3/26 |
| EP | 0 878 974 A1 | 11/1998 | ............ | H04Q 7/22 |
| EP | 0 998 026 A1 | 3/2000 | | |
| EP | 0 994 567 A2 | 4/2000 | ............ | H04B 1/00 |
| EP | 1 111 821 A2 | 6/2001 | .......... | H04B 17/00 |
| EP | 0 948 131 B1 | 3/2002 | | |
| GB | 2 286 749 A | 8/1995 | ............ | H04B 7/08 |
| JP | 08-102618 | 4/1996 | .......... | H01Q 25/00 |
| JP | 11-330838 | 11/1999 | ............ | H01Q 3/26 |
| WO | WO 95/26116 | 9/1995 | ............ | H04Q 7/36 |
| WO | WO 95/34102 | 12/1995 | ............ | H01Q 1/38 |
| WO | WO 97/44914 | 11/1997 | ............ | H04B 1/50 |
| WO | WO 98/11626 | 3/1998 | .......... | H01Q 23/00 |
| WO | WO 98/39851 | 9/1998 | ............ | H04B 1/38 |
| WO | WO 98/09372 | 1/1999 | ............ | H04B 1/04 |
| WO | WO 98/50981 | 4/2001 | ............ | H01Q 3/26 |

OTHER PUBLICATIONS

Levine, E., Malamud, G., Shtrikman, S., and Treves, D., *A study Microstrip Array Antennas with the Feed Network*, IEEE Trans. Antennas Propagation, vol. 37, No. 4, Apr. 1989, pp. 426-434 (8 pages).

Herd, J.S., *Modelling of Wideband Proximity Coupled Microstrip Array Elements*, Electronic Letters, vol. 2, No. 16, Aug. 1990, pp. 1282-1284 (3 pages).

Hall, P.S., and Hall, C.M., *Coplanar Corporate Feed Effects in Microstrip Patch Array Design*, Proc. IEEE, vol. 135, pt. H, Jun. 1998, p. 180-186 (7 pages).

Zurcher, J.F. *The SSFIP: A Global Concept for High-Performance Broadband Planar Antennas*, Electronic Letters, vol. 24, No. 23, Nov. 1988, p. 1433-1435 (4 pages).

Zurcher, J.F. and Gardiol, F.E., *The SSFIP Principle: Broadband Patch Antennas*, Artech House, 1995, Chapter 3, pp. 45-60 (17 pages).

Song, H.J. and Bialkowski, M.E., *Ku-Band 16×16 Planar Array with Aperture-Coupled Microstrip-Patch Elements*, IEEE Antennas and Propagation Magazine, vol. 40, No. 5, Oct. 1998, pp. 25-29 (5 pages).

Lohtia, Anit et al., "Power Amplifier Linearization using Cubic Spline Interpolation", *IEEE*, (1993), No. 0-7803-1266-x/93, pp. 676-679.

Stapleton, Shawn P., "Amplifier Linearization Using Adaptive Digital Predistortion—The need for greater linearity can be addressed at the digital coding level", *Applied Microwave & Wireless*, Technical Feature, (Feb. 2001), pp. 72-77.

Vella-Coleiro, George, *Frequency-Dependent Phase Pre-Distortion for Reducing Spurious Emmissions in Communication Networks*, U.S. Appl. No. 10/O68,343, filed Feb. 5, 2002.

Judd, Mano D. et al., *Active Antenna for With Interleaved Arrays of Antenna Elements*, U.S. Appl. No. 10/256,860, filed Sep. 27, 2002.

DeBruyn, William P. et al., *An Uncorrelated Adaptive Predistorter*, U.S. Appl. No. 10/342,633, filed Jan. 15, 2003.

Leffel, Michael D., *Independence Between Paths that Predistort for Memory and Memory-Less Distortion in Power Amplifiers*, U.S. Appl. No. 10/406,959, filed Apr. 3, 2003.

* cited by examiner

OPTIMIZATION OF ERROR LOOPS IN DISTRIBUTED POWER AMPLIFIERS

FIELD OF THE INVENTION

This invention relates generally to radio frequency (RF) amplifier systems, and more particularly to an apparatus and method for optimizing error loops that attempt to reduce or eliminate intermodulation distortion (IMD) products in an array of distributed power amplifiers.

BACKGROUND OF THE INVENTION

Ideal, or theoretical, radio frequency (RF) power amplifiers act linearly, faithfully reproducing an amplified RF signal at their output without distortion. Unfortunately, in practice, physical RF power amplifiers are non-linear and add a certain amount of unwanted distortion to a signal, such distortion being realized as intermodulation distortion (IMD) products. Moreover, physical amplifiers have a finite ability to deliver gain and/or power. Thus, RF power amplifiers are often operated and configured in such a manner as to provide as much output power as possible at low cost.

In general, the cost of an amplifier increases with its maximum output power. Therefore, to maximize the cost effectiveness of a given RF power amplifier, the amplifier may be operated close to saturation to provide as much output power as possible. Operation close to saturation affords additional output power at the expense of increase IMD products.

Another manner of cost-effectively addressing the power requirements of some applications, and in particular many high power applications, is to use an array of lower cost RF power amplifiers in lieu of a single, more powerful, but more costly RF power amplifier. An array of RF power amplifiers often allows output powers beyond those attainable with a single amplifier while maintaining IMD products below the desired level. Even when such an array is used, amplifiers are operated close to saturation to reduce the number of amplifiers required in the array.

Operation of an amplifier close to saturation may increase the power of unwanted IMD products. These IMD products may cause interference within the normal operating frequency range of the amplifier, and may further impede proper transmission and reception of RF signals both within and outside the normal operating frequency range of the amplifier. Numerous techniques have been developed to reduce IMD products from amplified RF signals, including feed-forward, predistortion, and linear amplification with non-linear components (LINC), the former being briefly described hereinafter.

Recent increases in the demand for wireless communications devices have led to new frequency bands to increase capacity, such as, for example, the Universal Mobile Telecommunications System (UMTS) developed by the European Telecommunications Standard Institute for delivering 3G (third generation) services. Modern transmission protocols, such as UMTS, demand high linearity to prevent RF energy in one band from spilling over and interfering with other proximate channels. Certain modern transmission protocols also have high Peak-to-Average Power Ratio (PAR) carrier signals that make efficient linear amplifiers difficult to design.

Further, the effects of IMD products, manifested as interference and cross talk, may be compounded as a result of the close proximity of frequency bands. RF power amplifiers therefore must operate at high drive levels in order to achieve the high linearity demanded by broadband applications. Energy leakage resulting from one band spilling over into another can undesirably degrade the signal-to-noise (SNR) ratio or bit-error rate (BER) of the proximate frequency band.

In practice, it is unnecessary to completely eliminate all IMD products for a selected center frequency. Certain tolerable levels of IMD products are acceptable. When the terms "eliminate" or "reduce" are used herein with reference to the IMD products, it is understood that the IMD products should be suppressed below a certain tolerable level, even though they will not be entirely eliminated.

One common technique to reduce IMD to an acceptable level is feed-forward correction, whereby IMD products are manipulated so that at the final summing point the IMD products are substantially cancelled. Many feed-forward amplifiers use what is conventionally known as a pilot or carrier tone injection to assist in the control of the gain and phase of an error amplifier thereby minimizing IMD of a main amplifier. A carrier tone is generated and injected with the RF signal to be transmitted at the input of the main amplifier to simulate an artificial signal whose frequency content is known. The main amplifier produces a desired amplified signal and a simulated distortion product based on the carrier tone. At the output of the main amplifier, a carrier tone receiver detects the simulated distortion, not the actual distortion, and the gain and phase of the error amplifier are adjusted to minimize the simulated distortion, thereby optimizing the error loop. However, because the error amplifier is not adjusted in accordance with the actual distortion products of the RF signal, but rather with a carrier tone, the actual distortion products may not be entirely cancelled or the carrier tone may leak into the output, creating unwanted byproducts.

Another approach is to digitize the RF signals to baseband, filter out the desired frequency components, and then analyze the remaining undesired distortion components in a digital signal processor (DSP). This approach does not require the use of a carrier tone. The energy of these distortion components is located and measured in the DSP, and the error loop is adjusted until the undesired components are eliminated. For example, in one such design, a feed-forward amplification system uses mask detection compensation on an RF signal modulated according to a known modulation format. The RF signal is amplified, producing in-band frequency components and undesired out-of-band distortion components. The amplified signal is heterodyned to baseband so as to be centered about DC. A wide passband (1.25 MHz) bandpass filter is used to eliminate the in-band frequency components. A microprocessor queries a DSP for the energy at predetermined offsets (representative of an IMD location), and control signals adjust the gain-phase network, i.e., optimizes the error loop, in accordance with the out-of-band distortion components.

The above approach operates in an environment where signals are modulated according to a single known modulation format (CDMA). However, such an approach would not be well suited for detecting narrowband signals such as TDMA and their associated IMD products, in part due to the wide bandwidth of the filter (1.25 MHz).

RF signals may be modulated in accordance with one of any number of modulation formats which are well known in the art, including, TDMA, GSM, CDMA, WCDMA, QAM, and OFDM, each having differing bandwidths. For example, the bandwidth for a WCDMA signal is 3.84 MHz (wideband), and the bandwidth for a CDMA signal is 1.25 MHz. By contrast, a GSM signal has a bandwidth of 250 kHz, and a TDMA signal has a bandwidth of only 30 kHz (narrowband). If the signals are located in a PCS frequency band (1930 to 1990 MHz), a 60 MHz bandwidth is used. Thus, the bandwidth of a signal, depending on the modulation format and band used, may vary from 30 kHz to 3.84 MHz.

Thus, the implementation of a narrow band receiver in a known distortion band, i.e., a band where IMD products are known to occur, is a complex undertaking. For example, a narrowband tuner may require too much time to tune across a wide bandwidth, while a wideband tuner may not be able to detect the individual carriers of TDMA or GSM signals or their associated IMD products. In short, there is a tradeoff between the bandwidth of a tuner and the speed with which it can identify and eliminate IMD products.

Thus, the optimization of error loops in feed-forward amplifiers generally requires a rather complex approach such as carrier tone injection or implementation of narrowband receiver in known distortion bands. Both of these approaches are undesirable from a circuit complexity standpoint or, in the case of carrier tone injection, from an interference standpoint. Such complexity, and its associated cost, is furthered by the use of a number of RF power amplifiers in an array to meet a desired amount of radiated output power for a given cost.

Therefore, a need exists for an IMD reduction technique that is easy to implement and that does not introduce unwanted signals into the output of the RF amplifiers in an array.

BRIEF DESCRIPTION OF THE DRAWINGS

The accompanying drawings, which are incorporated in and constitute a part of this specification, illustrate embodiments of the invention and, together with the detailed description given below, serve to explain the principles of the invention.

DETAILED DESCRIPTION OF THE DRAWINGS

Figure 1:
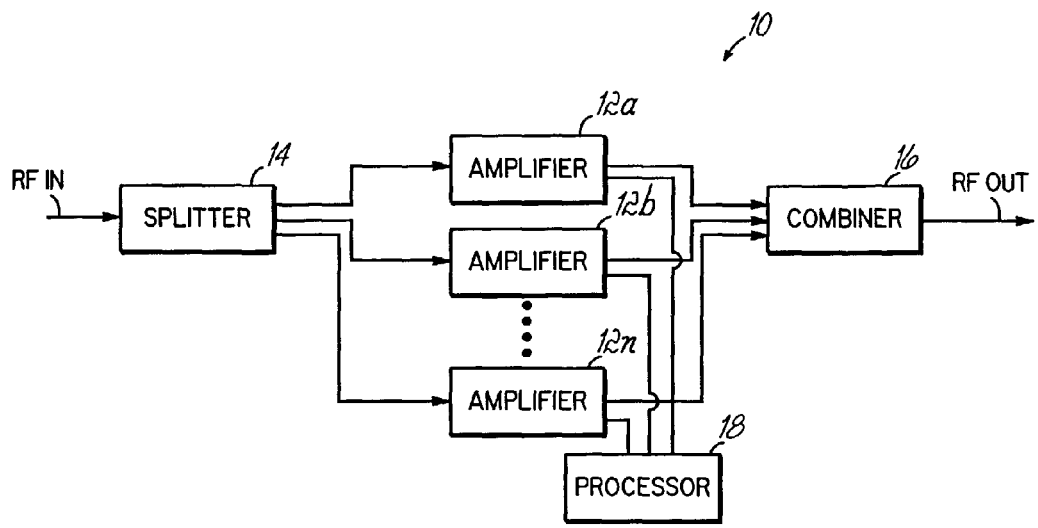
FIG. 1 is a block diagram of an embodiment of a distributed feed-forward radio frequency (RF) amplifier array in accordance with the principles of the present invention; and, FIG. 2 is a schematic diagram of one of the feed-forward RF amplifiers shown in FIG. 1.
Figure 2:
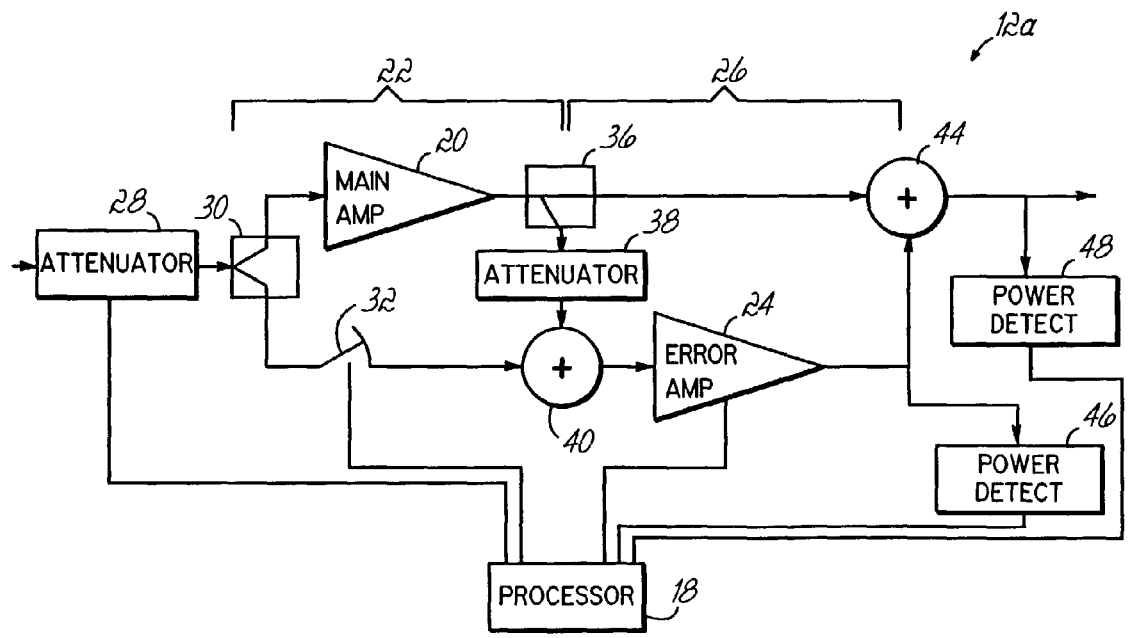

With reference to FIGS. 1 and 2, there is shown a feed-forward RF power amplifier comprising a main amplifier within a carrier null loop and an error amplifier within an error loop. The carrier null loop comprises a switch configured to selectively disable the carrier null loop. By disabling the carrier null loop, the actual RF signal is injected into the error loop to allow optimization of the error loop using the actual RF signal. Such an amplifier, when used in an array, provides a feed-forward technique that is easy to implement and that does not introduce unwanted signals into the output of the RF amplifiers in the array.

Referring first to FIG. 1, there is shown one embodiment 10 of an amplifier system in accordance with the principles of the present invention. Amplifier system 10 is defined by an array of distributed or parallel feed-forward radio frequency (RF) power amplifiers 12a–n, there being N number of amplifiers as illustrated. Those skilled in the art will appreciate that any number of amplifiers may be used as desired in an effort to achieve a desired amount of radiated output power for a given cost without departing from the spirit of the present invention.

Coupled to the inputs and outputs of the feed-forward RF power amplifiers 12a–n are splitter 14 and combiner 16. Splitter 14 provides an input (RF IN) to amplifier system 10, dividing an input signal between the amplifiers 12a–n, while combiner 16 combines the outputs of the amplifiers 12a–n for coupling to an antenna (not shown).

Those skilled in the art will appreciate that, in other embodiments of the present invention, combiner 16 may be eliminated, the amplifiers 12a–n being coupled to respective elements of an antenna, such that the antenna combines the output of the amplifiers 12a–n through "far field summing" or "far field combining". An example of an antenna utilizing farfield combining may be found in "Active Antenna with Interleaved Arrays of Antenna Elements" by Judd, et al., Ser. No. 10/256,860, filed Sep. 27, 2002, which is hereby incorporated by reference in its entirety, and which is assigned to the same assignee as the present invention.

It has been determined that, for a distributed amplifier system, such as amplifier system 10 comprised of a number (N) of feed-forward power amplifiers arranged in a parallel array, each amplifier may be sequentially disabled from the array and its error loop optimized. The net power lost to the array while a single amplifier is undergoing optimization may be described by the equation: $10(\log(N/(N-1)))$, where N is, again, the number of amplifiers in the array. Thus, for example, for an array of 8 amplifiers (N=8), the power lost during optimization would be approximately 0.58 decibels (dB). Considering the optimization process may only be functional for a small percentage of time, such a power loss has been found to be acceptable.

Those skilled in the art will appreciate that any sequence, e.g., numerically, when the amplifiers are numbered, randomly, pseudo-randomly, etc., may be used in disabling the amplifiers and optimizing their error loops. Moreover, more than one amplifier may be disabled at any one given time, provided the loss in output power is acceptable. Those skilled in the art will appreciate that neither the order of disabling the amplifiers nor the number of amplifiers disabled constitutes a departure from the spirit of the present invention.

Operably coupled to each amplifier 12a–n is processor 18. Processor 18 is configured to sequentially disable each amplifier 12a–n from the array and optimize its error loop as will be described hereinafter. Moreover, such optimization may be conducted using the RF signal applied to each amplifier 12a–n in the normal course of operation or the "actual RF signal" as referred to herein, rather than a carrier tone. The use of the actual RF signal eliminates the complexity associated with carrier tone injection and the potential for interference resulting therefrom, and further eliminates the need for and difficulty of implementing a narrowband receiver in known distortion bands.

Referring now to FIG. 2, a schematic diagram of the feed-forward RF amplifier 12a shown in FIG. 1 is illustrated. Those skilled in the art will appreciate that amplifiers 12b–n are substantially similar in construction and operation to amplifier 12a, and are not shown, as such illustration would be redundant. Processor 18 is shown for purposes of further illustration.

Amplifier 12a comprises a main amplifier 20 within a main or carrier null loop 22 and an error amplifier 24 within an error loop 26. Amplifier 12a further comprises attenuators 28, 38, power splitter or divider 30, switch 32, coupler 36, combiners or summers 40, 44, and power detectors 46, 48.

More specifically, carrier null loop 22 comprises power splitter or divider 30, main amplifier 20, switch 32, coupler 36, attenuator 38, and combiner or summer 40. Similarly, error loop 26 comprises coupler 36, attenuator 38, combiner or summer 40, error amplifier 24, and combiner or summer 44.

Coupled to error amplifier 24 and combiner or summer 44 are power detectors 46 and 48, respectively. Power detectors 46 and 48 may be root mean squared (RMS) power detection devices that are well known to those skilled in the art.

Processor 18 is operably coupled to attenuator 28, switch 32, and error amplifier 24 for purposes of controlling the attenuation, actuation, and gain and/or phase, respectively, thereof. Processor 18 is also coupled to power detectors 46 and 48 for purposes measuring the output power of error and main amplifiers 24 and 20, respectively.

In operation the feed-forward configuration of amplifier 12a isolates the intermodulation distortion (IMD) products generated by main amplifier 20 and manipulates them in error loop 26 such that the manipulated IMD products cancel the IMD products generated by main amplifier 20 when they are recombined in combiner or summer 44, resulting in an output signal with reduced IMD. The IMD products from the main and error amplifiers 20, 24 are ideally 180 degrees out-of-phase and have equal magnitude in order to achieve proper cancellation.

In the normal operation of amplifier 12a, an input signal is coupled through attenuator 28, set by processor 18 for little or no attenuation, to power splitter or divider 30, a portion of the signal then being coupled to main amplifier 20 and the rest coupled to through switch 32 to combiner or summer 40. The output of main amplifier 20 is coupled to coupler 36 that samples a portion of the output signal, coupling the signal to attenuator 38, with the rest of the signal coupled to combiner or summer 44 in carrier null loop 22. Attenuator 38 sets the level of the sampled signal, and is coupled to combiner or summer 40. The sampled signal from main amplifier 20 is combined with the original input signal in combiner or summer 40 to substantially cancel the original input signal carrier, i.e., destructive interference, resulting primarily in IMD products being coupled to error amplifier 24. The output of coupler 36 in error loop 26 is combined with the output of error amplifier 24 in combiner or summer 44, such that the result of destructive interference between IMD from the output from the main and error amplifiers 20, 24 produces an output signal with acceptable IMD.

To optimize error loop 26 of amplifier 12a, processor 18 reduces the RF input signal power by increasing the attenuation of attenuator 28. This must be done to prevent overdriving error amplifier 24 while the carrier null loop is disabled. In certain embodiments of the present invention, 20 to 30 dB of attenuation has been found to be acceptable. Processor 18 then actuates switch 32 to open-circuit or selectively disable carrier null loop 22. Such selective operation of switch 32, by disabling carrier null loop 22, provides injection of the actual RF signal into error loop 26. Processor 18 then, while monitoring power detector 46, adjusts attenuator 28 such that approximately the same power in error amplifier 24 is achieved as is present during normal operation. Processor 18 then adjusts the amplitude and phase of error amplifier 24 to minimize the power measured using power detector 48, thereby optimizing error loop 26 using the actual RF signal. Finally, processor 18 actuates switch 32, closing carrier null loop 22, and resets attenuator 28 for little or no attenuation.

Those of ordinary skill in the art having the benefit of the instant disclosure will be readily able to synthesize the necessary program code for processor 18 to sequentially disable each amplifier 12a–n from the array and optimize its error loop through the use and control of attenuator 28, switch 32, error amplifier 24, and power detectors 46,48 in the manner described herein. Again, such optimization is performed using the actual RF signal applied to each amplifier 12a–n.

Thus, embodiments consistent with the present invention provide a number of unique advantages over conventional designs. For example, such embodiments eliminate the complexity associated with carrier tone injection and the potential for interference resulting therefrom. Such embodiments also eliminate the need for and difficulty of implementing a narrow-band receiver in known distortion bands, be the bandwidth narrow or wide. In addition, such embodiments are often well suited to mass production, with a relatively low per-unit cost.

Various additional modifications may be made to the illustrated embodiments without departing from the spirit and scope of the invention. Therefore, the invention lies in the claims hereinafter appended.

What is claimed is:

1. An apparatus comprising:
a main amplifier within a carrier null loop and configured to receive an RF input signal;
an error amplifier within an error loop;
a switch disposed in the carrier null loop and configured to selectively disable the carrier null loop to provide injection of an actual RF signal amplified by the main amplifier into the error loop to allow optimization of the error loop using the actual RF signal, wherein the switch inhibits reception of the RF input signal by the error amplifier when the carrier null loop is disabled.

2. The apparatus of claim 1, further comprising
a power splitter disposed in the carrier null loop and coupled intermediate the switch and the main amplifier and configured to divide the RF input signal.

3. The apparatus of claim 2, further comprising a coupler disposed in the carrier null loop and coupled to the main amplifier and configured to sample the output of the main amplifier.

4. The apparatus of claim 3, further comprising an attenuator disposed in the carrier null loop and coupled to the coupler and configured to select the level of the sampled output of the main amplifier.

5. The apparatus of claim 4, further comprising a first combiner disposed in the carrier null loop and coupled to the attenuator and the switch and configured to substantially cancel the input signal carrier during normal operation resulting in primarily IMD products being coupled to the error amplifier.

6. The apparatus of claim 5, wherein the error amplifier is coupled to the first combiner.

7. The apparatus of claim 6, further comprising a second combiner disposed in the error loop and coupled to the coupler and the error amplifier and configured to combine IMD products generated by the main amplifier and IMD products manipulated in the error loop, thereby producing an output signal with acceptable IMD.

8. The apparatus of claim 7, further comprising a power detector coupled to the second combiner and configured to be read by a processor.

9. The apparatus of claim 1, further comprising a processor, the switch controlled by the processor.

10. An apparatus comprising:
a main amplifier within a carrier null loop;
an error amplifier within an error loop;

a switch disposed in the carrier null loop and configured to selectively disable the carrier null loop to provide injection of an actual RF signal amplified by the main amplifier into the error loop to allow optimization of the error loop using the actual RF signal;

a processor, the switch controlled by the processor;

an attenuator, the attenuator configured to reduce the level of the actual RF signal injected into the error loop, the attenuator also controlled by the processor.

11. The apparatus of claim 9, further comprising a power detector coupled to the error amplifier and configured to be read by the processor.

12. An amplifier system, the system comprising:

an array of amplifiers, with each such amplifier comprising:

a main amplifier within a carrier null loop;

an error amplifier within an error loop;

a switch disposed in the carrier null loop and configured to selectively disable the carrier null loop to provide injection of an actual RF signal amplified by the main amplifier into the error loop to allow optimization of the error loop using the actual RF signal and while the carrier null loop in at least one other amplifier in the array is enabled.

13. The amplifier system of claim 12, wherein each amplifier further comprises a power splitter disposed in the carrier null loop and coupled to the switch and the main amplifier and configured to divide an RF input signal.

14. The amplifier system of claim 13, wherein each amplifier further comprises a coupler disposed in the carrier null loop and coupled to the main amplifier and configured to sample the output signal of the main amplifier.

15. The amplifier system of claim 14, wherein each amplifier further comprises an attenuator disposed in the carrier null loop and coupled to the coupler and configured to select the level of the sampled output signal.

16. The amplifier system of claim 15, wherein each amplifier further comprises a first combiner disposed in the carrier null loop and coupled to the attenuator and the switch and configured to substantially cancel the input signal carrier during normal operation resulting in primarily IMD products being coupled to the error amplifier.

17. The amplifier system of claim 16, wherein the error amplifier is coupled to the first combiner in each amplifier.

18. The amplifier system of claim 17, wherein each amplifier further comprises a second combiner disposed in the error loop and coupled to the coupler and the error amplifier and configured to combine IMD products generated by the main amplifier and IMD products manipulated in the error loop, thereby producing an output signal with acceptable IMD.

19. The amplifier system of claim 18, wherein each amplifier further comprises a power detector coupled to the second combiner and configured to be read by a processor.

20. The amplifier system of claim 12, further comprising a processor, the switch within each amplifier controlled by the processor.

21. The amplifier system of claim 20, wherein each amplifier further comprises an attenuator, the attenuator configured to reduce the level of the actual RF signal injected into the error loop, the attenuator also controlled by the processor.

22. The amplifier system of claim 20, wherein each amplifier further comprises a power detector coupled to the error amplifier and configured to be read by the processor.

* * * * *